(12) United States Patent
Restaino et al.

(10) Patent No.: US 7,847,402 B2
(45) Date of Patent: Dec. 7, 2010

(54) BEOL INTERCONNECT STRUCTURES WITH IMPROVED RESISTANCE TO STRESS

(75) Inventors: Darryl D. Restaino, Modena, NY (US); Griselda Bonilla, Fishkill, NY (US); Christos D. Dimitrakopoulos, Baldwin Place, NY (US); Stephen M. Gates, Ossining, NY (US); Jae H. Kim, Seoul (KR); Michael W. Lane, Cortland Manor, NY (US); Xiao H. Liu, Briarcliff Manor, NY (US); Son V. Nguyen, Yorktown Heights, NY (US); Thomas M. Shaw, Peekskill, NY (US); Johnny Widodo, Singapore (SG)

(73) Assignees: International Business Machines Corporation, Armonk, NY (US); Chartered Semiconductor Manufacturing, Ltd, Singapore (SG); Samsung Electronics Co., Ltd, Gyeonggi-do (KR)

( * ) Notice: Subject to any disclaimer, the term of this patent is extended or adjusted under 35 U.S.C. 154(b) by 463 days.

(21) Appl. No.: 11/676,522

(22) Filed: Feb. 20, 2007

(65) Prior Publication Data
US 2008/0197513 A1    Aug. 21, 2008

(51) Int. Cl.
*H01L 23/48* (2006.01)
*H01L 23/52* (2006.01)

(52) U.S. Cl. .................. 257/758; 257/762; 257/773
(58) Field of Classification Search ............... 257/758, 257/761–766, 773–775, E23.02, E23.152, 257/E23.194, 781, 784
See application file for complete search history.

(56) References Cited

U.S. PATENT DOCUMENTS

| | | | |
|---|---|---|---|
| 6,303,505 B1 | 10/2001 | Ngo et al. | |
| 6,319,819 B1 | 11/2001 | Besser et al. | |
| 6,383,925 B1 | 5/2002 | Ngo et al. | |
| 6,429,128 B1 | 8/2002 | Besser et al. | |
| 6,506,677 B1 | 1/2003 | Avanzino et al. | |
| 6,617,690 B1 | 9/2003 | Gates et al. | |
| 6,764,951 B1 | 7/2004 | van Ngo | |
| 6,949,830 B2 * | 9/2005 | Owada et al. | 257/760 |
| 2007/0281497 A1 * | 12/2007 | Liu et al. | 438/781 |

OTHER PUBLICATIONS

U.S. Appl. No. 11/162,666, filed Sep. 19, 2005.

* cited by examiner

*Primary Examiner*—Hung Vu
(74) *Attorney, Agent, or Firm*—Daryl Neff; Yuanmin Cai

(57) ABSTRACT

A chip is provided which includes a back-end-of-line ("BEOL") interconnect structure. The BEOL interconnect structure includes a plurality of interlevel dielectric ("ILD") layers which include a dielectric material curable by ultraviolet ("UV") radiation. A plurality of metal interconnect wiring layers are embedded in the plurality of ILD layers. Dielectric barrier layers cover the plurality of metal interconnect wiring layers, the dielectric barrier layers being adapted to reduce diffusion of materials between the metal interconnect wiring layers and the ILD layers. One of more of the dielectric barrier layers is adapted to retain compressive stress while withstanding UV radiation sufficient to cure the dielectric material of the ILD layers, making the BEOL structure better capable of avoiding deformation due to thermal and/or mechanical stress.

13 Claims, 3 Drawing Sheets

BEOL INTERCONNECT STRUCTURES WITH IMPROVED RESISTANCE TO STRESS

BACKGROUND OF THE INVENTION

The present invention relates to semiconductor devices, and more particularly, to back-end-of-line (BEOL) interconnect structures.

Integrated circuits typically include a plurality of semiconductor devices and interconnect wiring. Networks of metal interconnect wiring typically connect the semiconductor devices from above the semiconductor portion of the substrate. Multiple levels of metal interconnect wiring above the semiconductor portion of the substrate are connected together to form a back-end-of-line ("BEOL") interconnect structure. Within such structure, metal lines run parallel to the substrate and conductive vias run perpendicular to the substrate, the conductive vias interconnecting the different levels of metal wiring lines.

Two developments contribute to increased performance of contemporary integrated circuits. One of them is the use of copper as the interconnect metal in BEOL interconnect structures, due to the higher conductivity of copper than other traditional metals such as aluminum. Another development is the use of a low dielectric constant ("low-K") dielectric material in interlevel dielectric ("ILD") layers of the structure.

When copper is used as the metal in the interconnect wiring layers, a dielectric barrier layer or "cap" is typically required between copper features and the ILD layer to prevent copper from diffusing into certain types of ILD dielectric material to prevent the copper from spoiling the ILD dielectric material.

Under certain circumstances, chips may be subjected to external stresses, either during the manufacture or packaging of the chips, or when the packaged chips are mounted or installed in an electronic system for use. Occasionally, such stresses can cause cracking and delamination of dielectric and metal films therein. Difficulties lie in finding appropriate materials and manufacturing processes which permit copper metal lines to be utilized in certain types of low-K ILD materials, particularly when high stress conditions are present after UV processing.

SUMMARY OF THE INVENTION

In accordance with an aspect of the invention, a chip is provided which includes a back-end-of-line ("BEOL") interconnect structure. The BEOL interconnect structure includes a plurality of interlevel dielectric ("ILD") layers which include a dielectric material curable by ultraviolet ("UV") radiation. A plurality of metal interconnect wiring layers are embedded in the plurality of ILD layers. Dielectric barrier layers cover the plurality of metal interconnect wiring layers, the dielectric barrier layers being adapted to reduce diffusion of materials between the metal interconnect wiring layers and the ILD layers. One of more of the dielectric barrier layers is adapted to retain compressive stress while withstanding UV radiation sufficient to cure the dielectric material of the ILD layers, making the BEOL structure better capable of avoiding deformation due to thermal and/or mechanical stress.

DETAILED DESCRIPTION

Certain low dielectric constant ("low-K") low-K ILD materials, e.g., SiCOH, are best cured using UV radiation, or require ultraviolet ("UV") to cure. Exposure to UV radiation can cause the properties of materials utilized in a BEOL interconnect structure to change. Sometimes, such changes can lead to defects in the BEOL interconnect structure which might appear later after the chip has undergone stresses attendant with long-term use.

Figure 1:
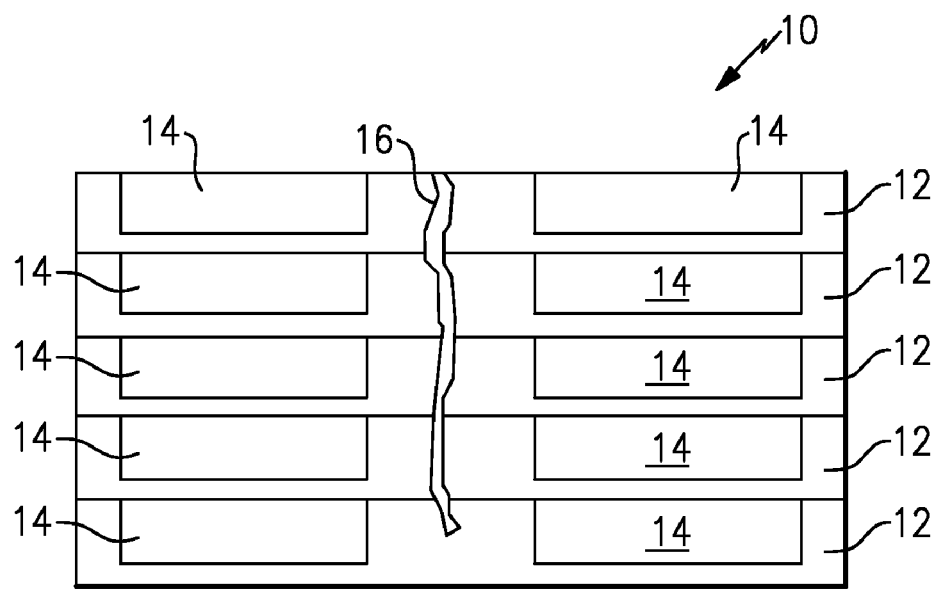
FIG. 1 is a sectional view illustrating a BEOL interconnect structure used for modeling effects of stress.

To test the long-term reliability of a BEOL interconnect structure having a UV-cured low-K dielectric, the inventors modeled the effects of thermal cycling stress upon a BEOL interconnect structure 10 similar to that shown in FIG. 1. As shown in FIG. 1, the model BEOL interconnect structure 10 includes a series of low-K ILD material layers 12, each including a dielectric material such as porous SiCOH, for example. Embedded within each ILD layer 12 is a metal wiring interconnect layer 14. When SiCOH is exposed to UV radiation, it tends to acquire tensile stress. When subjected to thermal cycling stress, tensile stress in such low-K dielectric material can damage the BEOL interconnect structure.

Specifically, stress corrosion cracks arise over time in the low-K ILD material when the model BEOL interconnect structure 10 is cycled between low and high temperature extremes. As shown in FIG. 1, features 14 of the metal wiring interconnect layer are aligned with each other in the BEOL test structure 10, a factor which can heighten the effects of long-term stress such as due to cyclical application of thermal and/or mechanical stress thereto. As a result of such thermal cycling, a crack 16 develops between adjacent features 14 of each metal wiring layer, the crack extending from the uppermost ILD layer 12 downward to the lowermost one of the ILD layers 12. If an actual chip having similar UV-cured low-K ILD layers were subjected to similar stresses, one can predict from the results of modeling the BEOL interconnect structure shown in FIG. 1 that the actual chip would also exhibit cracks in the ILD layers.

Figure 2:
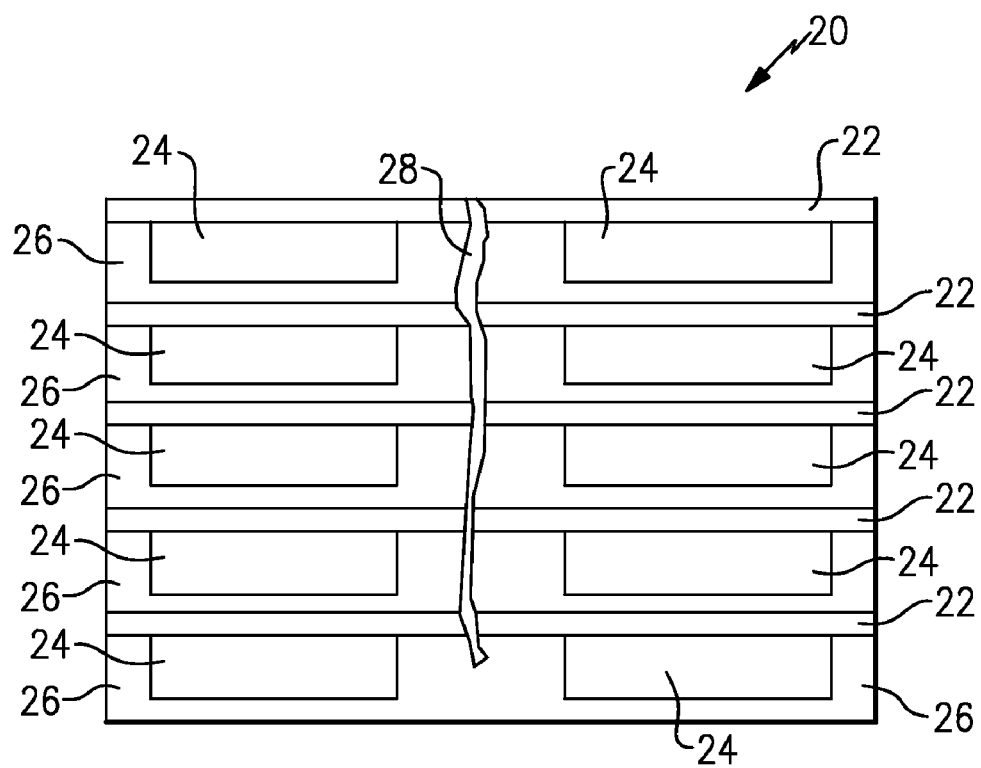
FIG. 2 is a sectional view illustrating a modified BEOL interconnect structure used for modeling effects of stress.

FIG. 2 illustrates a model BEOL interconnect structure 20 similar to that shown in FIG. 1, but in which a dielectric barrier layer 22 overlies each of the metal features 24 embedded in respective ones of the ILD layers. FIG. 2 illustrates the result of further modeling by the inventors that when the dielectric barrier layer 22 has an internal tensile stress or becomes tensile-stressed during curing of the ILD dielectric material with UV radiation, a stress corrosion crack 28 extends through both the ILD layers 26 and dielectric barrier layers 22 of the structure 20. The presence of the dielectric barrier layer 22 alone, when such barrier layer has tensile stress, does not avoid the crack 28 from emerging and propagating through several ILD layers 26 and dielectric barrier layers 22 of the structure 20. In fact, the tensile dielectric barrier layer may even contribute to the severity of the resulting crack.

Figure 3A:
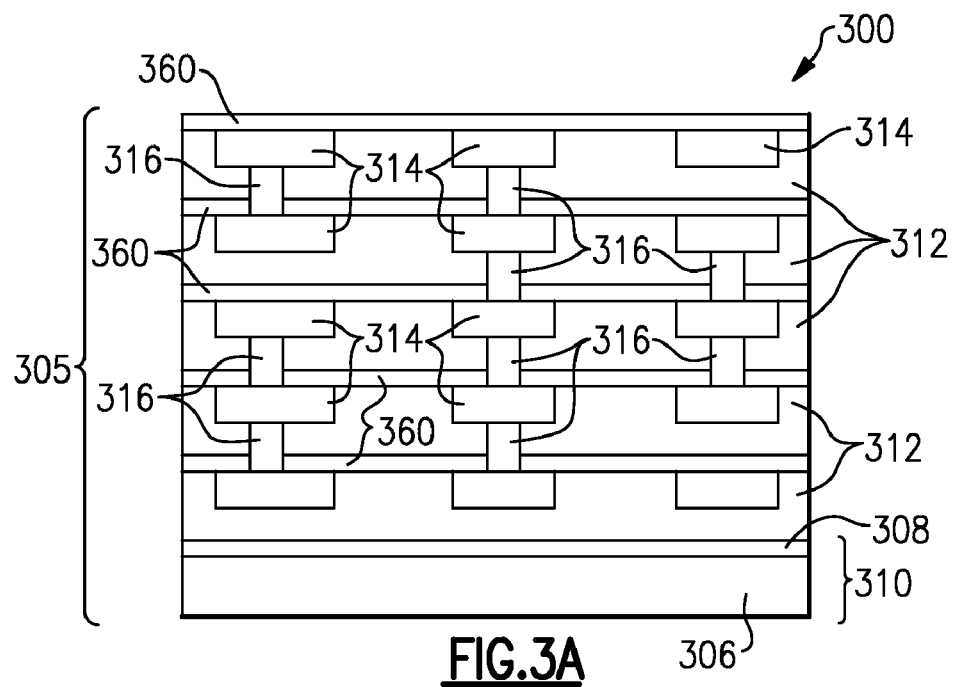
FIG. 3A is a sectional view of a BEOL interconnect structure in accordance with a first embodiment of the invention.

Referring now to FIG. 3A, a first embodiment of the invention will now be described. FIG. 3A illustrates a BEOL interconnect structure 300 of a chip 305. The BEOL interconnect structure is formed atop a front-end-of-line ("FEOL") portion 310 of the chip that includes a FEOL semiconductor devices in a semiconductor substrate portion 306 and conductors typically provided in an FEOL interconnect layer 308 between the BEOL interconnect structure 300 and the semiconductor substrate 306. Together, the BEOL interconnect structure 300 and the FEOL interconnect layer 308 provide interconnect wiring among and between semiconductor devices of the chip and external connection pads of the chip.

The BEOL interconnect structure includes a series of ILD layers 312. Each of the ILD layers preferably includes of a low-K UV-curable dielectric material. Preferably, the dielectric material consists essentially of one or more of porous SiCOH. The dielectric constant of the ILD material preferably lies within a range of 1.8 to 2.6, with 2.4 being an exemplary value. Copper wiring lines 314 are embedded within the series of ILD layers, typically as damascene processed lines inlaid within trenches in the ILD layers. Vertically oriented conductive vias provided conductive paths between the copper wiring lines. Typically, the vias are also formed by a damascene process, and vias of one level may be formed at the same time as the conductive lines of that same level in a "dual damascene" type process. However, the conductive lines can be formed by other processes such as blanket deposition and subtractive patterning, such a by reactive ion etching.

The inventors have discovered a way to increase the ability of the BEOL interconnect structure 300 to withstand thermal and/or mechanical stress by providing compressive stressed dielectric barrier layers 360 overlying each of the copper wiring lines 314. Compressive stressed dielectric barrier layers 360 help counteract tensile stresses present in the copper metal wiring lines of the BEOL structure as initially formed. The compressive stresses in the barrier layers 360 can avoid severe deformation of the BEOL interconnect structure 300 due to thermal and mechanical stresses over the use lifetime of the chip.

However, the dielectric barrier layers 360 are also required to not unduly increase the effective dielectric constant of the BEOL interconnect structure. In addition, the dielectric barrier layers 360 must also withstand processing used to form the ILD layers, e.g., UV radiation used to cure ILD layers when such layers consist essentially of a low-K dielectric material, e.g., porous SiCOH.

Figure 3B:
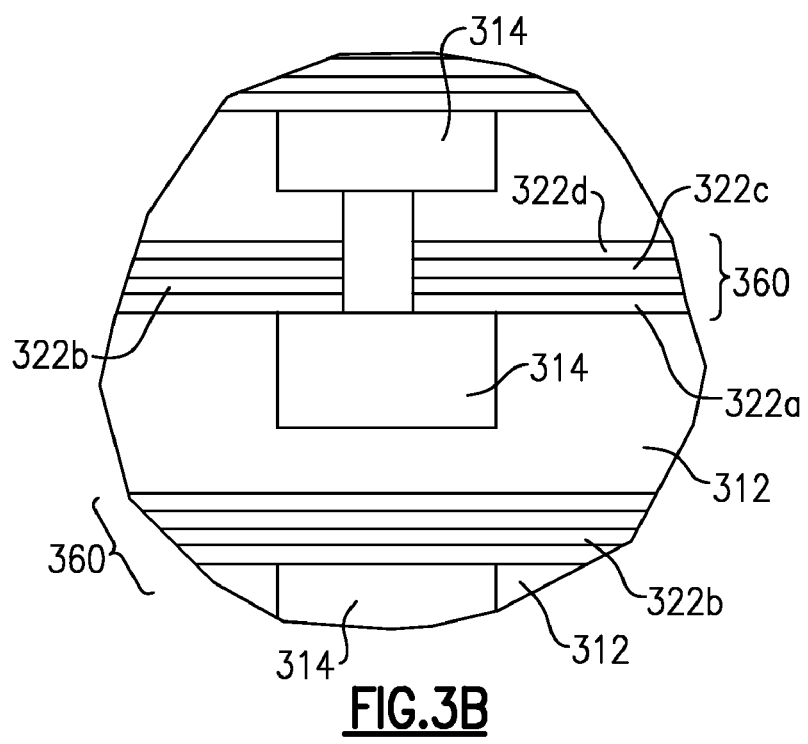
FIG. 3B is a magnified fragmentary sectional view of the BEOL interconnect structure illustrated in FIG. 3A.

Referring to FIG. 3B, one solution discovered by the inventors is to provide a dielectric barrier layer 360 which includes a series of two or more successively deposited compressive-stressed sublayers, e.g. sublayers 322a, 322b, 322c, etc., each sublayer having an low-K dielectric material composition such as SiCNH. The multi-sublayered structure within each dielectric barrier layer 360 retains compressive stress better than one individual dielectric barrier layer 360 would standing alone. Preferably, the effective value of the stress for the whole dielectric barrier layer 360 is between about −0.1 GPa and about −0.5 GPa, after the ILD layers have been cured by UV radiation.

One reason why the dielectric barrier 360 retains sufficient stress may be because each sublayer 322a, 322b, etc. of the barrier 360 absorbs stress but ineffectively transfers the absorbed stress to each higher sublayer in succession. Thus, the sublayer 322a immediately adjacent to the copper wiring line 318 absorbs a portion of the tensile stress in the wiring line 314 and becomes less compressive as a result. However, such sublayer 322a transfers substantially less than all of the stress it absorbs from the copper wiring line 314 to the next adjacent sublayer 322b. In turn, the next adjacent sublayer 322b transfers substantially less than all of the stress that it absorbs from sublayer 322b to the next higher sublayer 322c, and so on. With the combination of two or more sublayers 322a, 322b, etc., a dielectric barrier layer 360 is provided which preferably exhibits a compressive stress of between about −0.1 GPa and about −0.5 GPa to the ILD layer 312 immediately adjacent to the dielectric barrier layer.

Figure 4:
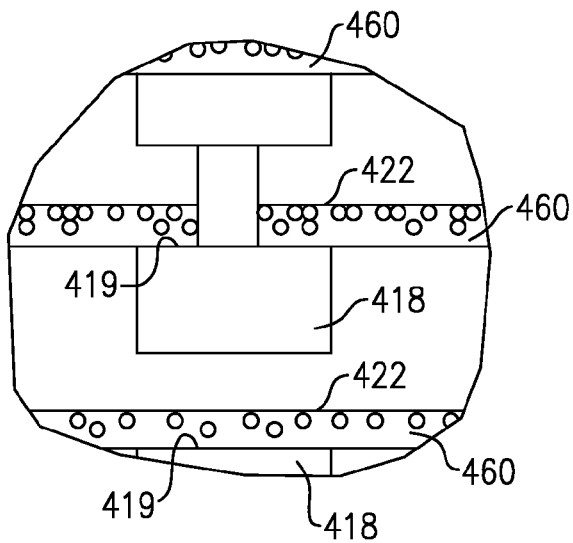
FIG. 4 is a magnified fragmentary sectional view of the BEOL interconnect structure in a variation of the embodiment shown in FIGS. 3A-3B.

In a variation of the above-described embodiment, FIG. 4 illustrates the structure of a compressive stressed dielectric barrier layer 460 utilized in place of the above-described dielectric barrier layers 360 (FIGS. 3A-3B). In this case, each dielectric barrier layer 460 is formed by depositing a layer including a first low-K dielectric material, e.g., SiCNH, and then applying a post-deposition treatment with hydrogen thereto. The resulting dielectric barrier layer 460 has a lower hydrogen concentration region at the surface 419 of the copper metal line 418 and a higher hydrogen concentration region near its top surface farther from the copper metal line 418. Preferably, but not strictly required, the gradient of the hydrogen concentration within the dielectric barrier layer 460 monotonically increases with distance from the top surface 419 of the copper metal line 418 to the top surface 422 of the barrier layer 460. Such barrier layer structure 460 is retains a stress (compressive) of between about −0.1 GPa and −0.4 GPa after exposure of the ILD layers to the UV radiation used to cure the SiCNH dielectric material of the ILD layers.

Figure 5:
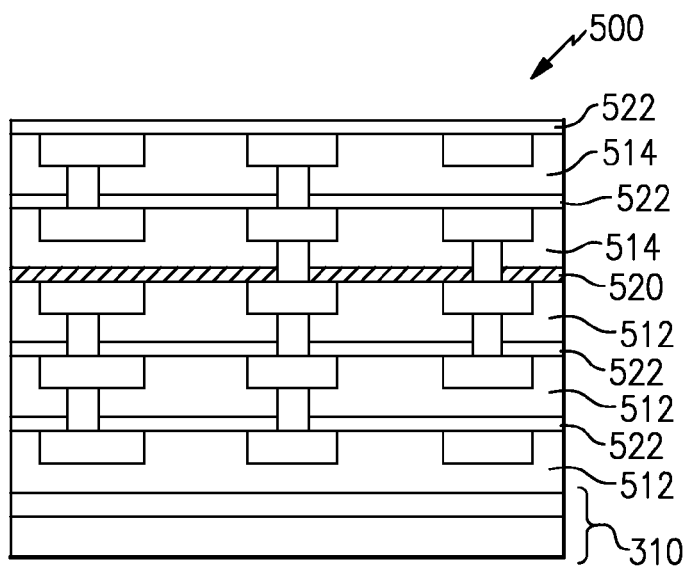
FIG. 5 is a sectional view of a BEOL interconnect structure in accordance with a third embodiment of the invention.

FIG. 5 is a partial sectional view of a BEOL interconnect structure 500 in accordance with another embodiment of the invention. Similar to that shown and described above, the BEOL interconnect structure 500 is formed atop an FEOL (semiconductor) portion 310 of a chip for interconnection of devices of the chip. In the BEOL interconnect structure 500 shown in FIG. 5, one or more dielectric barrier layers 520 within the structure includes compressive stressed silicon nitride. Silicon nitride typically is disfavored for use as the dielectric barrier layer in BEOL interconnect structures having low-K ILD layers, because its own dielectric constant, at about 7 or above, is higher than the target range for dielectric constants. Accordingly, silicon nitride is usually avoided for use as the dielectric barrier layer overlying copper metal lines in BEOL interconnect structures.

Silicon nitride is very capable of retaining compressive stress despite exposure to doses of UV radiation required for curing SiCOH dielectric layers. Moreover, the thickness of the silicon nitride barrier layer utilized in the BEOL interconnect structure helps maintain the rigidity of the structure against tensile stresses which would ordinarily cause the ILD layers 512 below the silicon nitride barrier layer 520 and the ILD layers 514 above the barrier layer to deform.

Accordingly, in the BEOL interconnect structure 500, silicon nitride is utilized sparingly as a dielectric barrier layer, and thus is provided strategically only at one or more locations where its use can provide the most benefit without causing the effective dielectric constant $K_{\textit{eff}}$ of the BEOL interconnect structure to exceed an allowable value.

The effective dielectric constant $K_{\textit{eff}}$ is determined by considering the contribution of each dielectric material towards the total capacitance between conductive lines of adjacent wiring levels according to the formula $C = K_{\textit{eff}} A / d$. To keep the effective dielectric constant of the structure 500 from exceeding an allowable value, dielectric barrier layers at other locations of the BEOL interconnect structure have a dielectric constant much lower than that of silicon nitride. While it is beneficial for such lower dielectric constant material to be compressive stressed and be able to withstand degradation due to the curing dose of UV radiation, it is not essential. Therefore, in this structure, NBLOK is utilized as the dielectric barrier layer 522 at locations of the BEOL interconnect structure other than the one silicon nitride barrier layer 520.

Figure 6:
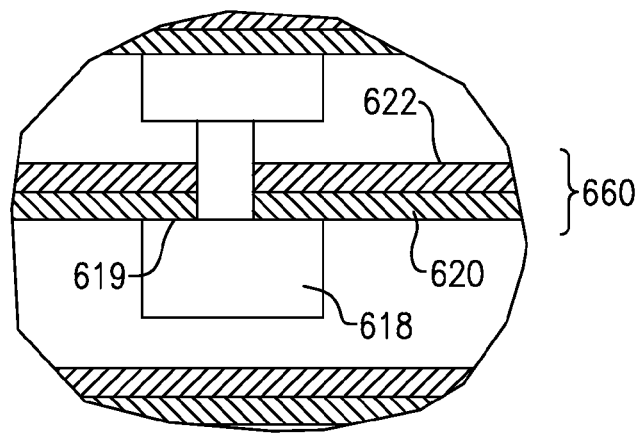
FIG. 6 is a magnified sectional view of the BEOL interconnect structure in a variation of the embodiment illustrated in FIGS. 3A-3B.

FIG. 6 illustrates the structure of a dielectric barrier layer 660 for utilization as the dielectric barrier layer, e.g., layer 360, in a BEOL interconnect structure such as the structure 300 described above with reference to FIGS. 3A-3B. In this embodiment, each dielectric barrier layer 660 includes a lower layer 620 contacting the copper metal line 618 and a second layer 622 overlying the lower layer 620. The lower layer 620 includes a low-K dielectric material, preferably including a material such as SiCH, SiCNH or SiCOH. The second layer includes a low-K dielectric material which has a compressive stress following exposure of the ILD layers to UV radiation. In a particular example, the second layer includes a material such as silicon nitride and/or silicon oxide or a combination of the two. In this case, the low-K dielectric material of the lower layer 620 helps keep the effective dielectric constant $K_{eff}$ of the structure relatively low, since the higher K dielectric materials of silicon nitride and/or silicon oxide are spaced farther from a surface 619 of the copper wiring line 618. Preferably, $K_{eff}$ of the overall BEOL interconnect structure is less than 3.0.

While the invention has been described in accordance with certain preferred embodiments thereof, many modifications and enhancements can be made thereto without departing from the true scope and spirit of the invention, which is limited only by the claims appended below.

What is claimed is:

1. A chip including a back-end-of-line ("BEOL") interconnect structure, comprising:
   a plurality of interlevel dielectric ("ILD") layers, said plurality of ILD layers including a dielectric material curable by ultraviolet ("UV") radiation;
   a plurality of metal interconnect wiring layers, each embedded in one of said plurality of ILD layers; and
   a plurality of dielectric barrier layers, each covering one of said plurality of metal interconnect wiring layers, said plurality of dielectric barrier layers adapted to reduce diffusion of materials between said plurality of metal interconnect wiring layers and said plurality of ILD layers, at least some of said plurality of dielectric barrier layers being adapted to retain compressive stress while withstanding UV radiation sufficient to cure said dielectric material of said ILD layers.

2. The chip as claimed in claim 1, wherein said plurality of ILD layers and said plurality of dielectric barrier layers together have an effective dielectric constant of less than 3.0.

3. The chip as claimed in claim 1, wherein each of said dielectric barrier layers includes a plurality of sublayers.

4. The chip as claimed in claim 1, wherein at least one of said plurality of dielectric barrier layers includes a post-deposition treated layer including a low-K silicon-containing material.

5. The chip as claimed in claim 4, wherein said at least one dielectric barrier layer includes SiCNH, said at least one dielectric barrier layer having a top surface and a hydrogen concentration gradient in a direction normal to said top surface.

6. The chip as claimed in claim 1, wherein said plurality of metal interconnect wiring layers include first wiring layers having a first thickness and second wiring layers having a second thickness greater than said first thickness, wherein said plurality of dielectric barrier layers includes at least one layer including silicon nitride having a compressive stress, said at least one layer being disposed between adjacent ones of said first wiring layer and said second wiring layer, and, otherwise, said plurality of dielectric barrier layers including a second dielectric material, said second dielectric material having a dielectric constant lower than a dielectric constant of silicon nitride.

7. The chip as claimed in claim 6, wherein said second dielectric material includes SiCNH.

8. The chip as claimed in claim 1, wherein at least one of said plurality of dielectric barrier layers includes a first layer including a low-K dielectric material adjacent to one of said metal interconnect wiring layers and a second layer including at least one of silicon nitride or silicon dioxide overlying said first layer.

9. The chip as claimed in claim 8, wherein said first layer includes at least one of SiCNH, SiCOH, or SiCH.

10. The chip as claimed in claim 1, wherein at least one of said plurality of ILD layers includes SiCOH and at least one of said plurality of dielectric barrier layers includes porous SiCOH.

11. The chip as claimed in claim 1, wherein said BEOL interconnect structure is free of stress cracks.

12. The chip as claimed in claim 1, wherein at least ones of said dielectric barrier layers are compressive stressed.

13. The chip as claimed in claim 1, wherein at least ones of said dielectric barrier layers are compressive stressed between about −0.1 GPa and about −0.5 GPa.

* * * * *